(12) United States Patent
Lee et al.

(10) Patent No.: US 9,171,820 B2
(45) Date of Patent: Oct. 27, 2015

(54) METHOD OF MANUFACTURING SEMICONDUCTOR DEVICE INCLUDING THERMAL COMPRESSION

(71) Applicants: Kil Yong Lee, Uiwang-si (KR); Jae Sun Han, Uiwang-si (KR); Jong Hyuk Eun, Uiwang-si (KR)

(72) Inventors: Kil Yong Lee, Uiwang-si (KR); Jae Sun Han, Uiwang-si (KR); Jong Hyuk Eun, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 14/095,000

(22) Filed: Dec. 3, 2013

(65) Prior Publication Data

US 2014/0179065 A1     Jun. 26, 2014

(30) Foreign Application Priority Data

Dec. 21, 2012  (KR) .................. 10-2012-0150675

(51) Int. Cl.
*H01L 21/00*     (2006.01)
*H01L 23/00*     (2006.01)
*H05K 3/36*      (2006.01)
(Continued)

(52) U.S. Cl.
CPC ............ *H01L 24/83* (2013.01); *G02F 1/13452* (2013.01); *H01L 24/27* (2013.01); *H01L 24/29* (2013.01); *H05K 3/361* (2013.01); *H01L 2224/27003* (2013.01); *H01L 2224/27436* (2013.01); *H01L 2224/27848* (2013.01); *H01L 2224/29019* (2013.01); *H01L 2224/2919* (2013.01); *H01L 2224/2929* (2013.01); *H01L 2224/2939* (2013.01); *H01L 2224/2949* (2013.01); *H01L 2224/29316* (2013.01); *H01L 2224/29339* (2013.01); *H01L 2224/29344* (2013.01); *H01L 2224/29347* (2013.01); *H01L 2224/29355* (2013.01); *H01L 2224/29363* (2013.01); *H01L 2224/29387* (2013.01); *H01L 2224/29416* (2013.01); *H01L 2224/29439* (2013.01); *H01L 2224/29444* (2013.01); *H01L 2224/29447* (2013.01); *H01L 2224/29455* (2013.01); *H01L 2224/29486* (2013.01); *H01L 2224/32227* (2013.01); *H01L 2224/83193* (2013.01); *H01L 2224/83203* (2013.01); *H01L 2224/83862* (2013.01); *H01L 2924/15788* (2013.01); *H05K 3/323* (2013.01)

(58) Field of Classification Search
CPC .................................. H05K 3/00; H05K 3/10
USPC ............. 156/566, 580; 29/829, 832; 257/783; 438/119, 121
See application file for complete search history.

(56) References Cited

U.S. PATENT DOCUMENTS 6,137,183 A * 10/2000 Sako ............................. 257/783
6,409,866 B1 * 6/2002 Yamada ........................ 156/219
(Continued)

FOREIGN PATENT DOCUMENTS

JP       2005-197032 A    7/2005
KR   10-2012-0076181 A    7/2012

*Primary Examiner* — Caleb Henry
(74) *Attorney, Agent, or Firm* — Lee & Morse, P.C.

(57) ABSTRACT

A method of manufacturing a semiconductor device includes attaching a curable film to a first connection member including a first circuit terminal, attaching a conductive film to a second connection member including a second circuit terminal, and thermally compressing the first connection member to the second connection member, with the first connection member and the second connection member placed such that the curable film and the conductive film face each other.

8 Claims, 5 Drawing Sheets

(51) Int. Cl.
*G02F 1/1345* (2006.01)
*H05K 3/32* (2006.01)

(56) References Cited

U.S. PATENT DOCUMENTS

| | | | |
|---|---|---|---|
| 6,651,319 B2* | 11/2003 | Havas et al. | 29/832 |
| 6,767,763 B1* | 7/2004 | Uchiyama | 438/116 |
| 6,769,469 B2* | 8/2004 | Yamada | 156/556 |
| 6,777,071 B2* | 8/2004 | Cobbley et al. | 428/323 |
| 7,088,005 B2* | 8/2006 | Lee | 257/783 |
| 7,144,471 B2* | 12/2006 | Kobayashi et al. | 156/272.2 |
| 7,446,424 B2* | 11/2008 | Lu et al. | 257/783 |
| 7,521,293 B2* | 4/2009 | Ogata | 438/119 |
| 7,833,837 B2* | 11/2010 | Yang et al. | 438/119 |
| 8,258,625 B2* | 9/2012 | Fujiwara | 257/737 |
| 8,518,304 B1* | 8/2013 | Sammakia et al. | 252/500 |
| 8,889,441 B2* | 11/2014 | Takai et al. | 438/27 |
| 2002/0098620 A1* | 7/2002 | Ding et al. | 438/113 |
| 2004/0224441 A1* | 11/2004 | Saito | 438/119 |
| 2004/0234763 A1* | 11/2004 | Saito | 428/402.2 |
| 2007/0031995 A1* | 2/2007 | Kaneko | 438/119 |
| 2008/0108181 A1* | 5/2008 | Chan et al. | 438/119 |
| 2009/0189254 A1* | 7/2009 | Kaneya et al. | 257/618 |
| 2010/0304533 A1* | 12/2010 | Hashimoto | 438/119 |
| 2012/0202321 A1* | 8/2012 | Dunne et al. | 438/119 |

* cited by examiner

Fig. 4a - Table 1

| Product type | | | E 1 | E 2 | E 3 | E 4 | E 5 | CE 1 | CE 2 | CE 3 |
|---|---|---|---|---|---|---|---|---|---|---|
| | | | Separable | Separable | Separable | Separable | Separable | Double layer | Combined | Combined |
| Composition | Curable layer | Initiator | 5 | 10 | 15 | 10 | 5 | 10 | 10 | 15 |
| | | Binder | 85 | 85 | 80 | 85 | 85 | 40 | 35 | 35 |
| | | Curing system | - | - | - | - | - | 30 | 27 | 27 |
| | | Additive | 10 | 5 | 5 | 5 | 10 | 20 | 25 | 20 |
| | | Conductive particles | - | - | - | - | - | 3 | 3 | 3 |
| | Conductive layer | Initiator | - | - | - | - | - | 10 | 10 | 15 |
| | | Binder | 47 | 50 | 50 | 50 | 47 | 40 | 35 | 35 |
| | | Curing system | 30 | 30 | 30 | 30 | 30 | 30 | 27 | 27 |
| | | Additive | 20 | 20 | 20 | 20 | 20 | 20 | 25 | 20 |
| | | Conductive particles | 3 | 3 | 3 | 3 | 3 | - | 3 | 3 |
| Film formation | Engraving roll | | O | O | O | X | O | X | X | X |

Fig. 4b - Table 2

| Product type | | E1 Separable | | E2 Separable | | E3 Separable | | E4 Separable | | E5 Separable | | CE 1 Double layer | CE 2 Combined | CE 3 Combined |
|---|---|---|---|---|---|---|---|---|---|---|---|---|---|---|
| | | Curable layer | Conductive layer | Curable layer | Conductive layer | Curable layer | Conductive layer | Curable layer | Conductive layer | Curable layer | Conductive layer | | | |
| Storage stability[1] | Initial | 140 | 80 | 160 | 78 | 185 | 81 | 159 | 75 | 160 | 55 | 180 | 178 | 200 |
| | After storage at 40°C for 24 hr | 135 | 75 | 150 | 70 | 163 | 75 | 155 | 65 | 155 | 53 | 117 | 120 | 140 |
| | After storage at 40°C for 72 hr | 130 | 69 | 143 | 63 | 155 | 64 | 140 | 57 | 155 | 50 | 65 | 60 | 55 |
| Adhesive strength after storage at 40°C for 24 hr[2] | | 820 | | 900 | | 940 | | 550 | | 920 | | 80 | 85 | 100 |
| Adhesive strength after storage at 40°C for 72 hr[2] | | 800 | | 860 | | 920 | | 500 | | 900 | | 50 | 40 | 65 |

[1] (heating value, J/g)
[2] (gf/cm)

METHOD OF MANUFACTURING SEMICONDUCTOR DEVICE INCLUDING THERMAL COMPRESSION

CROSS-REFERENCE TO RELATED APPLICATION

Korean Patent Application No. 10-2012-0150675, filed on Dec. 21, 2012, in the Korean Intellectual Property Office, and entitled: "Method Of Manufacturing Semiconductor Device," is incorporated by reference herein in its entirety.

BACKGROUND

1. Field

The present example embodiment relates to a method of manufacturing a semiconductor device using a separable anisotropic conductive film including a curable film and a conductive film.

2. Description of the Related Art

An anisotropic conductive film is a film on which an adhesive, where conductive particles such as metal-plated plastic or metallic particles are dispersed, is coated, and is widely used for connection of circuits in the flat panel display field and for mounting components in the semiconductor field.

SUMMARY

Embodiments are directed to a method of manufacturing a semiconductor device, the method including attaching a curable film to a first connection member including a first circuit terminal, attaching a conductive film to a second connection member including a second circuit terminal, and thermally compressing the first connection member to the second connection member, with the first connection member having the curable film attached thereto and the second connection member having the conductive film attached thereto placed such that the curable film and the conductive film face each other.

The curable film may include a thermal initiator and a binder.

The conductive film may include a binder, curing materials, and conductive particles, and may be free from a thermal initiator.

The curable film or the conductive film may have corrugations formed therein.

The corrugations may have prism shapes.

The first circuit terminal and the second circuit terminal may be connected to each other when the first connection member having the curable film attached thereto and the second connection member having the conductive film attached thereto are subjected to thermal compression.

The first connection member may be a chip on film (COF), a flexible printed circuit board (FPCB), or a semiconductor chip, and the second connection member may be a glass panel or a printed circuit board (PCB).

The curable film may have a difference of 40 J/g or less between heating values after storage for 24 hours at 40° C. and after storage for 72 hours at 40° C., and the conductive film may have a difference of 40 J/g or less between heating values after storage for 24 hours at 40° C. and after storage for 72 hours at 40° C.

BRIEF DESCRIPTION OF THE DRAWINGS

Features will become apparent to those of skill in the art by describing in detail example embodiments with reference to the attached drawings in which:

FIGS. 4a and 4b illustrate Tables 1 and 2, respectively.

DETAILED DESCRIPTION

Figure 1A:
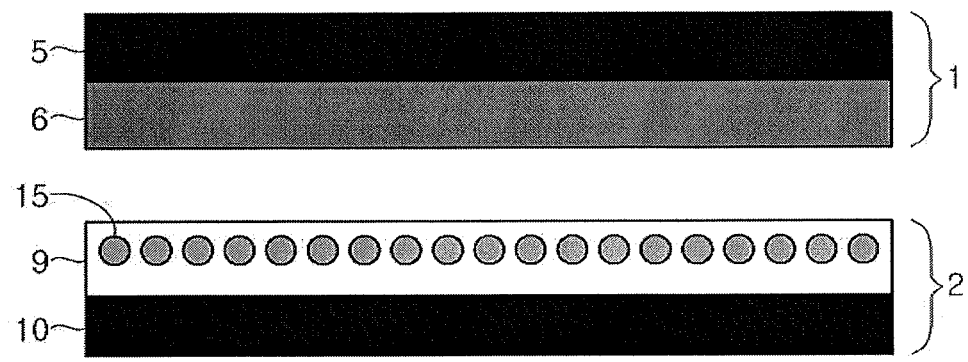
FIG. 1a illustrates a sectional view of an anisotropic conductive film including a curable film 1 and a conductive film 2 according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

An example embodiment is directed to an anisotropic conductive film including a curable film and a conductive film, wherein the curable film is attached to a first connection member including a first circuit terminal without being coupled to the conductive film and the conductive film is attached to a second connection member including a second circuit terminal without being coupled to the curable film. Herein, the expression "not coupled to," "separated from" or derivatives thereof used for a film means that one film exists independently of another film without being combined with the other film.

Another example embodiment is directed to a method of manufacturing a semiconductor device, which includes: attaching a curable film to a first connection member including a first circuit terminal; attaching a conductive film to a second connection member including a second circuit terminal; and thermally compressing the first connection member to the second connection member, with the first connection member and the second connection member placed such that the curable film and the conductive film face each other.

In an example embodiment, the conductive film includes a conductive layer and a base film, and the curable film includes a curable layer and a base film. In this case, thermal compression includes thermally compressing the conductive layer and the curable layer, with the base films removed therefrom.

The operation of attaching the curable film to the first connection member including the first circuit terminal may include placing the curable film on the first connection member and pre-compressing the curable film to the first connection member, e.g., at a temperature of 25° C. to 60° C. under a load of 1 MPa to 5 MPa for 1 second to 5 seconds. For example, pre-compression may be performed at a temperature of 30° C. to 50° C. under a load of 1 MPa to 3 MPa for 1 second to 3 seconds.

The operation of attaching the conductive film to the second connection member including the second circuit terminal may include placing the conductive film on the second connection member and pre-compressing the conductive film to the second connection member, e.g., at a temperature of 25° C. to 60° C. under a load of 1 MPa to 5 MPa for 1 second to 5 seconds. For example, pre-compression may be performed at a temperature of 30° C. to 50° C. under a load of 1 MPa to 3 MPa for 1 second to 3 seconds.

The operation of thermally compressing the first connection member to the second connection member may include thermally compressing the first connection member to the second connection member at a temperature of 130° C. or less, e.g., 120° C. or less or 100° C. or less, under a load of 5 MPa or less for 10 seconds or less, e.g., 5 seconds or less. For example, this operation may include thermal compression at a temperature of 80° C. to 120° C. under a load of 1 MPa to 3 MPa for 1 second to 4 seconds.

Figure 1B:
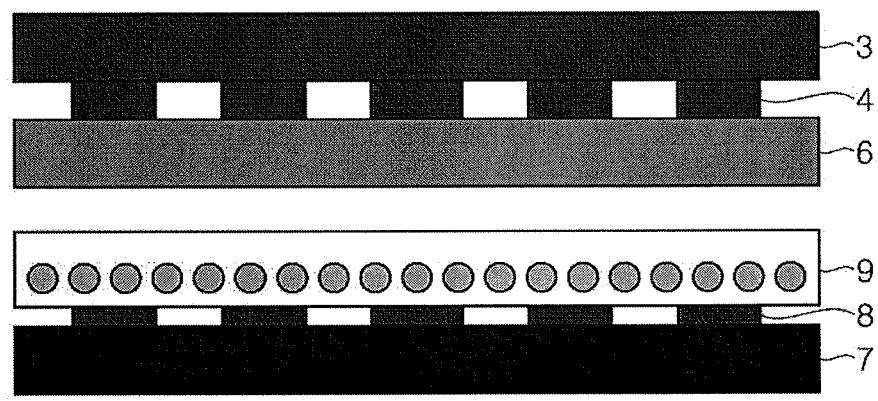
FIG. 1b illustrates a sectional view of the anisotropic conductive film, in which the curable film and the conductive film of FIG. 1a are attached to connection members, respectively.
Figure 1C:
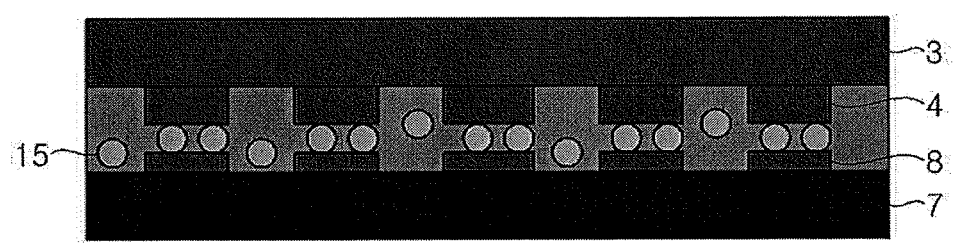
FIG. 1c illustrates a sectional view of the anisotropic conductive film, in which the connection members of FIG. 1b are attached to each other.

Hereinafter, an anisotropic conductive film and a method of manufacturing a semiconductor device according to an example embodiment will be described in more detail with reference to FIGS. 1a to 1c. FIG. 1a illustrates a sectional view of an anisotropic conductive film including a curable film 1 and a conductive film 2 according to an example embodiment, FIG. 1b illustrates a sectional view of the anisotropic conductive film, in which the curable film and the conductive film of FIG. 1a are attached to connection members, respectively, and FIG. 1c illustrates a sectional view of the anisotropic conductive film, in which the connection members of FIG. 1b are attached to each other.

In the example embodiment shown in FIG. 1a, the anisotropic conductive film includes a curable film 1 and a conductive film 2.

The curable film 1 may include a first base film 5 and a curable layer 6. The curable layer 6 may include a thermal initiator and a binder, and may additionally include hydrophobic silica. Further, the curable layer 6 may be free from conductive particles.

The conductive film 2 may include a conductive layer 9 and a second base film 10. The conductive layer 9 may include a binder, curing materials which may be cured, and conductive particles 15. The conductive layer 9 may be free from a thermal initiator. A suitable material that initiates thermal curing of the curing materials of the conductive layer 9 may be used as the thermal initiator of the curable layer 6.

Referring to FIGS. 1a and 1b, the curable film 1 may be attached to a first connection member 3, and the conductive film 2 may be attached to a second connection member 7. The first connection member 3 includes a first circuit terminal 4, and the second connection member 7 includes a second circuit terminal 8. After the curable film 1 and the conductive film 2 are attached to the first and second connection members 3, 7, respectively, the first and second base films 5, 10 may be removed therefrom.

A suitable member that includes a circuit terminal through which currents may flow may be used as the first and second connection members 3, 7. For example, the first connection member may be a chip-on-film (COF), a flexible printed circuit board (FPCB), or a semiconductor chip, and the second connection member may be a glass panel or a printed circuit board (PCB).

Referring to FIGS. 1a and 1c, the first and second circuit terminals 4, 8 may be connected to each other by thermally compressing the first connection member 3 to the second connection member 7, in which the curable layer 6 is attached to the first connection member 3 and the conductive layer 9 is attached to the second connection member 7.

The present example embodiment provides a method of manufacturing an anisotropic conductive film of a curable film and separate a conductive film, and a method of manufacturing a semiconductor using the same, which may maintain storage stability while realizing ultralow temperature rapid curing. The curable layer of the curable film may initiate curing only when contacting the conductive layer of the conductive film. Thus, curing may be prevented even when the curable layer is left alone for a long period of time, for example, for 6 months at room temperature, that is, 25° C., which may enhance storage stability.

In the above example embodiment, the curable layer of the curable film is cured when the first connection member having the curable film attached thereto and the second connection member having the conductive film attached thereto are thermally compressed to each other, whereby the first and second circuit terminals may be connected to each other. When the first connection member having the curable film attached thereto and the second connection member having the conductive film attached thereto are thermally compressed to each other, curing may occur due to reaction between the thermal initiator in the curable layer of the curable film and the curing system of the conductive layer of the conductive film, whereby the first and second circuit terminals may be connected to each other.

Figure 2A:
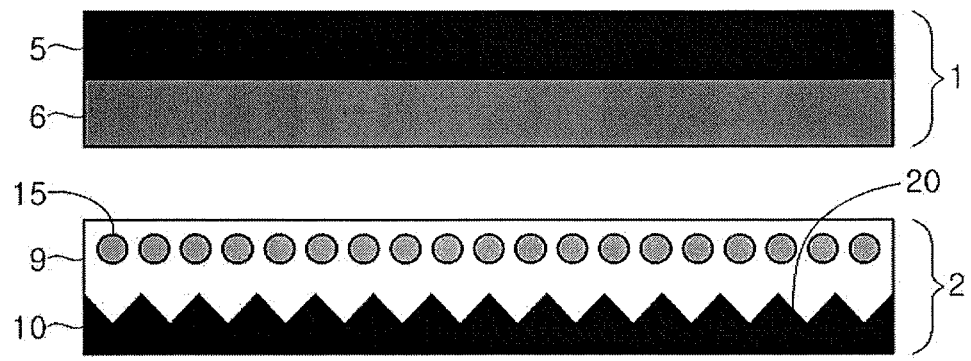
FIG. 2a illustrates a sectional view of an anisotropic conductive film including a curable film 1 and a conductive film 2 according to another example embodiment.

Next, an anisotropic conductive film according to another example embodiment will be described with reference to FIGS. 2a to 2c. FIG. 2a illustrates a sectional view of an anisotropic conductive film according to another example embodiment. The anisotropic conductive film according to the present example embodiment is different from that of the above example embodiment in that corrugations 20 are formed at an interface between the conductive layer 9 and the second base film 10 of the conductive film 2. Although the corrugations are illustrated as being formed at the interface between the conductive layer 9 and the second base film 10 of the conductive film 2 in FIG. 2a, the corrugations may be formed at the interface between the first base film 5 and the curable layer 6 of the curable film 1 in other embodiments.

The corrugations, e.g., prism-shaped corrugations, may be formed at the interface between the conductive layer 9 and the second base film 10 of the conductive film 2. For example, the corrugations may be formed in a predetermined pattern to widen or increase a contact area between the curable layer of the curable film and the conductive layer of the conductive film, such that curing reaction rate of curing materials by thermal initiator may be improved.

Figure 2B:
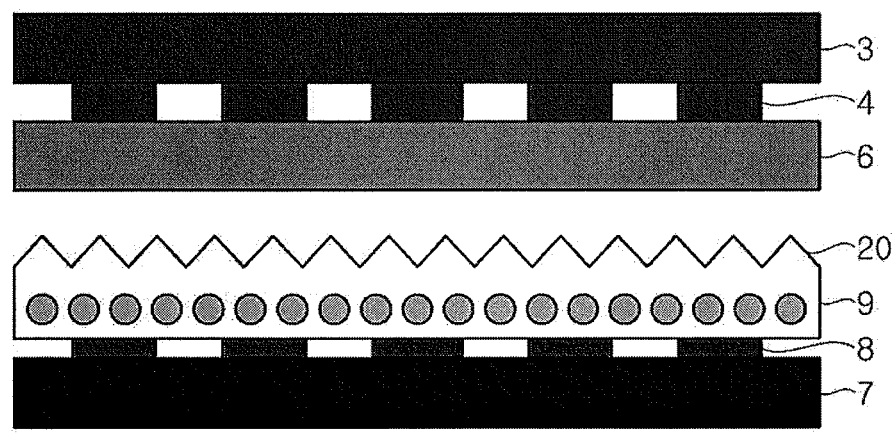
FIG. 2b illustrates a sectional view of the anisotropic conductive film, in which the curable film and the conductive film of FIG. 2a are attached to connection members, respectively.
Figure 2C:
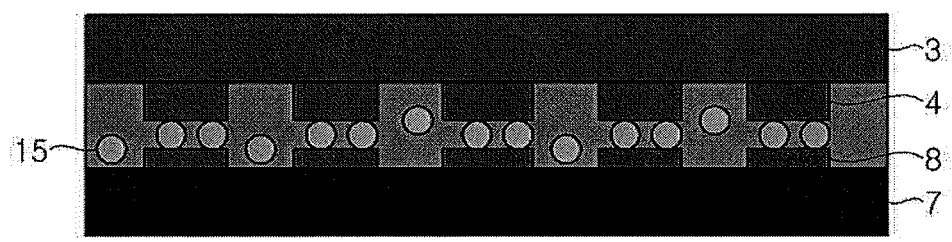
FIG. 2c illustrates a sectional view of the anisotropic conductive film, in which the connection members of FIG. 2b are attached to each other.

Next, referring to FIGS. 2a to 2c, the operation of connecting the first and second connection members 3, 7 to each other using the curable film 1 and the conductive film 2 is the same as in the above example embodiment, and a detailed description thereof will not be repeated here.

Figure 3A:
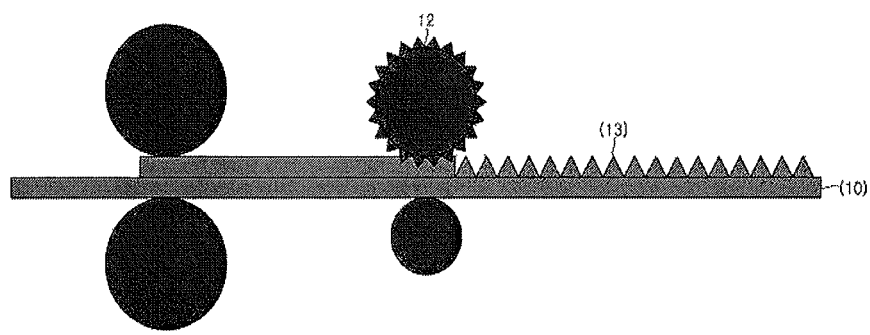
FIGS. 3a and 3b illustrate processes of manufacturing a conductive film according to an example embodiment.
Figure 3B:
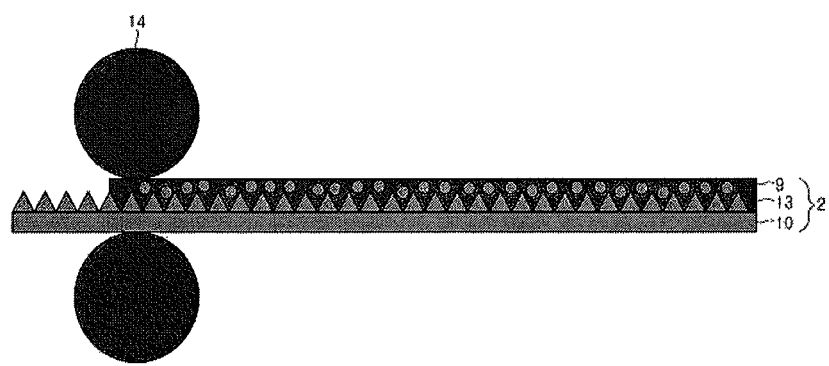

A process of forming corrugations at the interface will now be described with reference to FIGS. 3a and 3b. FIG. 3a illustrates a process of forming a release layer with prism-shaped corrugations 13 on a base film 10 of a conductive film using an engraving roll 12, and FIG. 3b illustrates a process of preparing a conductive film 2 by forming a conductive layer 9 on the base film 10 having the release layer 13 using a coating roll 14.

In another example embodiment, an anisotropic conductive film includes: a curable film having a difference of 40 J/g or less between heating values after storage for 24 hours at 40° C. and after storage for 72 hours at 40° C.; and a conductive film having a difference of 40 J/g or less between heating values after storage for 24 hours at 40° C. and after storage for 72 hours at 40° C., wherein the curable film and the conductive film are separated from each other.

As described above, the present example embodiment provides an anisotropic conductive film that is separated into a curable film and a conductive film to maintain storage stability at room temperature. Curing is initiated only when the thermal initiator of the curable film and the curing materials of the conductive film contact each other. Thus, curing may be prevented even when the curable film and the conducive film are left alone for a long period of time, for example, for 6 months at room temperature, that is, 25° C., which may enhance storage stability.

A method of measuring the heating value was as follows. An equilibrium state was set at 0° C. using a differential scanning calorimeter (DSC), and the heating value was then measured while increasing the temperature from 0° C. to 100° C. at a speed of 10° C. per minute.

In this example embodiment, the curable film is attached to the first connection member including the first circuit terminal without being coupled to the conductive film, and the conductive film is attached to the second connection member including the second circuit terminal without being coupled to the curable film.

In this example embodiment, the curing materials of the conductive film are cured by thermal initiator of the curable film when the first connection member having the curable film attached thereto and the second connection member having the conductive film attached thereto are thermally compressed to each other, whereby the first and second circuit terminals may be connected to each other. As the first and second connection members 3, 7 include circuit terminals, a suitable member through which currents may flow may be used as the first and second connection members 3, 7. For example, the first connection member may be a chip-on-film (COF), a flexible printed circuit board (FPCB), or a semiconductor chip, and the second connection member may be a glass panel or a printed circuit board (PCB). For example, the chip may be a driver IC including a drive circuit and the glass panel may be a panel for plasma display panels (PDPs).

According to yet another example embodiment, an anisotropic conductive film includes a curable film containing a binder and a thermal initiator; and a conductive film contains a binder, curing materials, and conduction particles. The curable film may be laminated with the conductive film during a connection process. The lamination of the curable film and the conductive film during a connection process means that the curable film and the conductive film attached to the respective connection members are laminated and cured only when the two connection members are thermally compressed.

Yet another example embodiment provides a method of manufacturing a semiconductor device, wherein a first and a second circuit terminal are connected, including: attaching a curable film to a first connection member including the first circuit terminal; attaching a conductive film to a second connection member including the second circuit terminal; and connecting the first circuit terminal with the second circuit terminal by thermally compressing the first connection member to the second connection member.

In this example embodiment, the curable film may be the curable film disclosed herein.

In this example embodiment, the conductive film may be the conductive film disclosed herein.

In this example embodiment, a suitable member including a circuit terminal through which currents may flow may be used as a first connection member or a second connection member.

In this example embodiment, thermal compression may be performed at a temperature of 130° C. or less, e.g., 120° C. or less or 100° C. or less, under a load of 5 MPa or less, for 10 seconds or less, e.g., 5 seconds or less.

Yet another example embodiment provides a circuit terminal-containing connection member to which a curable film containing a thermal initiator and a binder, and being free from conductive particles, is attached. A suitable member that includes a circuit terminal and through which current may flow may be used as the circuit terminal-containing connection member. For example, the circuit terminal-containing connection member may be a chip-on-film (COF), a flexible printed circuit (FPCB), or a semiconductor chip.

Yet another example embodiment provides a circuit terminal-containing connection member to which a conductive film including a binder, curing materials, and conductive particles, and being free from a thermal initiator, is attached. A suitable member that contains a circuit terminal and through which currents may flow may be used as the circuit terminal-containing connection member. For example, the circuit terminal-containing connection member may be a glass panel or a printed circuit board (PCB).

Next, a curable film and a conductive film of the anisotropic conductive film according to an example embodiment will be described in more detail.

Curable Film

According to the present example embodiment, the curable film may include a binder and a thermal initiator. The curable film may further include hydrophobic silica and/or other additives.

For example, the binder may include a thermoplastic resin. The thermoplastic resin may include one or more of acrylonitrile, phenoxy, butadiene, acryl, urethane, polyamide, olefin, silicone, or NBR (nitrile butadiene rubber) resins, etc.

The thermoplastic resin may have a weight average molecular weight of 1,000 g/mol to 1,000,000 g/mol. Within this range, the thermoplastic resin may provide suitable strength to the film, may not cause phase separation, and may prevent deterioration in adhesion to connection members.

The binder may be present in an amount of 50% by weight (wt %) to 95 wt % based on the total weight of the curable layer for the curable film in terms of solid content. Within this range, advantageous film formability may be secured.

Examples of the thermal initiator may include peroxide, azo, or isocyanate curing initiators, etc. For example, the thermal initiator may be an isocyanate curing agent, which may help achieve rapid low temperature curing. Examples of the peroxide curing initiators may include t-butyl peroxylaurate, 1,1,3,3-t-methylbutylperoxy-2-ethyl hexanoate, 2,5-dimethyl-2,5-di(2-ethylhexanoyl peroxy)hexane, 1-cyclohexyl-1-methylethyl peroxy-2-ethyl hexanoate, 2,5-dimethyl-2,5-di(m-toluoyl peroxy)hexane, t-butyl peroxyisopropyl monocarbonate, t-butyl peroxy-2-ethylhexyl monocarbonate, t-hexyl peroxy benzoate, t-butyl peroxy acetate, dicumyl peroxide, 2,5,-dimethyl-2,5-di(t-butyl peroxy)hexane, t-butyl cumyl peroxide, t-hexyl peroxyneodecanoate, t-hexyl peroxy-2-ethyl hexanoate, t-butyl peroxy-2-2-ethylhexanoate, t-butyl peroxy isobutyrate, 1,1-bis(t-butyl peroxy)cyclohexane, t-hexyl peroxy isopropyl monocarbonate, t-butyl peroxy-3,5,5-trimethyl hexanoate, t-butyl peroxypivalate, cumyl peroxy neodecanoate, di-isopropyl benzene hydroperoxide, cumene hydroperoxide, isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoyl peroxide, 3,5,5-trimethyl hexanoyl peroxide, benzoyl peroxytoluene, 1,1,3,3-tetramethyl butyl peroxyneodecanoate, 1-cyclohexyl-1-methyl ethyl peroxyneodecanoate, di-n-propyl peroxy dicarbonate, di-isopropyl peroxy carbonate, bis(4-t-butyl cyclohexyl)peroxy dicarbonate, di-2-ethoxy methoxy peroxy dicarbonate, di(2-ethyl hexyl peroxy)dicarbonate, dimethoxy butyl peroxy dicarbonate, di(3-methyl-3-methoxy butyl peroxy)dicarbonate, 1,1-bis(t-hexyl peroxy)-3,3,5-trimethyl cyclohexane, 1,1-bis(t-hexyl peroxy)cyclohexane, 1,1-bis(t-butyl peroxy)-3,3,5-trimethyl cyclohexane, 1,1-(t-butyl peroxy)cyclododecane, 2,2-bis(t-butylperoxy)decane, t-butyltrimethylsilyl peroxide, bis(t-butyl)dimethylsilyl peroxide, t-butyltriallylsilyl peroxide, bis(t-butyl)diallylsilyl peroxide, tris(t-butyl)arylsilyl peroxide, etc. Examples of the azo-based curing initiators may include 2,2'-azobis(4-methoxy-2,4-dimethyl valeronitrile), dimethyl 2,2'-azobis(2-methyl propionate), 2,2'-azobis(N-cyclohexyl-2-methyl propionamide), 2,2-azobis(2,4-dimethyl valeronitrile), 2,2'-azobis(2-methyl butyronitrile), 2,2'-azobis[N-(2-propenyl)-2-methylpropionamide], 2,2'-azobis(N-butyl-2-methyl propionamide), 2,2'-azobis[N-(2-propenyl)-2-methyl propionamide], 1,1'-azobis(cyclohexane-1-carbonitrile), 1-[(cyano-1-methylethyl)azo]formamide, etc. Examples of the isocyanate curing initiators may include polyisocyanates, such as an aliphatic polyisocyanate, alicyclic polyisocyanate, araliphatic polyisocyanate, aromatic polyisocyanate, and derivatives or modifiers thereof, etc. Examples of the aliphatic polyisocyanate may include trimethylenediisocyanate, tetramethylenediisocyanate, hexamethylenediisocyanate, pentamethylenediisocyanate, 1,2-propylenediisocyanate, 1,2-butylenediisocyanate, 2,3-butylenediisocyanate, 1,3-butylenediisocyanate, 2,4, 4- or 2,2,4-trimethylhexamethylenediisocyanate, 2,6-diisocyanatemethylcaproate, lysine ester triisocyanate, 1,4,8-triisocyanateoctane, 1,6,11-triisocyanateundecane, 1,8-diisocyanate-4-isocyanatemethyloctane, 1,3,6-triisocyanatehexane, 2,5,7-trimethyl-1,8-diisocyanate-5-isocyanatemethyloctane, etc. Examples of the alicyclic polyisocyanate may include 1,3-cyclopentene diisocyanate, 1,4-cyclohexane diisocyanate, 1,3-cyclohexane diisocyanate, 3-isocyanatemethyl-3,5,5-trimethylcyclohexylisocyanate (common name: isophorone diisocyanate), 4,4'-methylenebis(cyclohexylisocyanate), methyl-2,4-cyclohexane diisocyanate, methyl-2,6-cyclohexane diisocyanate, 1,3- or 1,4-bis(isocyanatemethyl)cyclohexane (common name: hydrogenated xylene diisocyanate) or mixtures thereof, norbornene diisocyanate, 1,3,5-triisocyanatecyclohexane, 1,3,5-trimethylisocyanatecyclohexane, 2-(3-isocyanatepropyl)-2,5-di(isocyanatemethyl)-bicyclo(2.2.1)heptane, 2-(3-isocyanatepropyl)-2,6-di(isocyanatemethyl)-bicyclo(2.2.1)heptane, 3-(3-isocyanatepropyl)-2,5-di(isocyanatemethyl)-bicyclo(2.2.1)heptane, 5-(2-isocyanateethyl)-2-isocyanatemethyl-3-(3-isocyanatepropyl)-bicyclo(2.2.1)heptane, 6-(2-isocyanateethyl)-2-isocyanatemethyl-3-(3-isocyanatepropyl)-bicyclo(2.2.1)heptane, 5-(2-isocyanateethyl)-2-isocyanatemethyl-2-(3-isocyanatepropyl)-bicyclo(2.2.1)-heptane, 6-(2-isocyanateethyl)-2-isocyanatemethyl-2-(3-isocyanatepropyl)-bicyclo(2.2.1)heptane, etc. Examples of the araliphatic polyisocyanate may include 1,3- or 1,4-xylene diisocyanate or mixtures thereof, ω,ω'-diisocyanate-1,4-diethylbenzene, 1,3- or 1,4-bis(1-isocyanate-1-methylethyl) benzene (common name: tetramethyl xylene diisocyanate) or mixtures thereof, araliphatic triisocyanate such as 1,3,5-triisocyanatemethylbenzene, etc. Examples of the aromatic polyisocyanate may include m-phenylene diisocyanate, p-phenylene diisocyanate, 4,4'-diphenyl diisocyanate, 1,5-naphthalene diisocyanate, 2,4'- or 4,4'-diphenylmethane diisocyanate or mixtures thereof, 2,4- or 2,6-torilene diisocyanate or mixtures thereof, 4,4'-toluidine diisocyanate, 4,4'-diphenylether diisocyanate, triphenylmethane-4,4',4''-triisocyanate, 1,3,5-triisocyanatebenzene, 2,4,6-triisocyanatetoluene, 4,4'-diphenylmethane-2,2',5,5'-tetraisocyanate, etc. These curing initiators may be used alone or as mixtures thereof.

The thermal initiator may be present in an amount of 1 wt % to 15 wt %, e.g. 3 wt % to 10 wt %, based on the total weight of the curable layer for the curable film in terms of solid content. Within this content range, the thermal initiator may provide excellent primary compression characteristics due to high curing rate.

Each of the hydrophobic silica and other additives may be present in an amount of 1 wt % to 15 wt %, based on the total weight of the curable layer for the curable film in terms of solid content.

Conductive Film

According to the invention, the conductive film may include a binder, curing materials, and conductive particles. The conductive film may further include hydrophobic silica and/or other additives.

The binder may include a thermoplastic resin. The thermoplastic resin may include one or more of acrylonitrile, phenoxy, butadiene, acryl, urethane, polyamide, olefin, silicone, and NBR (nitrile butadiene rubber) resins, etc.

The thermoplastic resin may have a weight average molecular weight of 1,000 g/mol to 1,000,000 g/mol. Within this range, the thermoplastic resin may provide suitable strength to the film, may not cause phase separation, and may prevent deterioration in adhesion.

The binder may be present in an amount of 20 wt % to 70 wt % based on the total weight of the conductive layer for the conductive film in terms of solid content. Within this range, advantageous film formability may be secured.

The curing materials may include a suitable material that may be cured through reaction with the thermal initiator in the curable film, and, for example, may include one or more of (meth)acrylate monomers, propylene oxide epoxy resins, urethane acrylates, amine compounds containing a terminal OH group, and thiol compounds containing a terminal OH group. For low temperature rapid curing, the amine compounds may be used as the curing material. Examples of the amine compounds may include 1,2-diaminoethane, 1,2- or 1,3-diaminopropane, 1,2-, 1,3- or 1,4-diaminobutane, 1,5-diaminopentane, 1,6-diaminohexane, piperazine, N-N'-bis-(2-aminoethyl)piperazine, 1-amino-3-aminomethyl-3,5,5-trimethyl-cyclohexane(isophorone diamine), bis-(4-aminocyclohexyl)methane, bis-(4-amino-3-butylcyclohexyl)methane, diamines such as 1,2-, 1,3- or 1,4-diaminocyclohexane and 1,3-diaminopropane, diethylenetriamine, triethylenetetramine, etc. The thiol compound may include, e.g., ethyl mercaptan, propyl mercaptan, benzyl mercaptan, phenylethyl mercaptan, 4-bromobenzyl mercaptan, 1-phenylethyl mercaptan, n-dodecyl mercaptan, t-tert-butylbenzyl mercaptan, 4-fluorobenzyl mercaptan, 2,4,6-trimethylbenzyl mercaptan, (4-nitrobenzyl) mercaptan, 2-trifluoromethylbenzyl mercaptan, 3,4-difluorobenzyl mercaptan, 3-fluorobenzyl mercaptan, 4-trifluoromethylbenzyl mercaptan, 4-bromo-2-fluorobenzyl mercaptan, or mixtures thereof, etc.

The (meth)acrylate monomer may include, e.g., 1,6-hexanediol mono(meth)acrylate, 2-hydroxyethyl(meth)acrylate, 2-hydroxypropyl(meth)acrylate, 2-hydroxybutyl(meth)acrylate, 2-hydroxy-3-phenyloxypropyl(meth)acrylate, 1,4-butanediol(meth)acrylate, 2-hydroxyethyl(meth)acryloyl phosphate, 4-hydroxycyclohexyl(meth)acrylate, neopentyl glycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth)acrylate, dipentaerythritol hexa(meth)acrylate, glycerine di(meth)acrylate, hydrofurfuryl(meth)acrylate, isodecyl(meth)acrylate, 2-(2-ethoxyethoxy)ethyl (meth)acrylate, stearyl(meth)acrylate, lauryl(meth)acrylate, 2-phenoxyethyl(meth)acrylate, isobornyl(meth)acrylate, tridecyl(meth)acrylate, ethoxylated nonylphenol(meth)acrylate, ethylene glycol di(meth)acrylate, triethylene glycol di(meth)acrylate, tetraethylene glycol di(meth)acrylate, polyethylene glycol di(meth)acrylate, 1,3-butylene glycol di(meth)acrylate, tripropylene glycol di(meth)acrylate, ethoxylated bisphenol-A di(meth)acrylate, cyclohexanedimethanol di(meth)acrylate, phenoxy-t-glycol (meth) acrylate, 2-methacryloyloxymethyl phosphate, 2-methacryloyloxyethyl phosphate, dimethylol tricyclodecane di(meth) acrylate, trimethylol propane benzoate acrylate, and mixtures thereof, etc.

The propylene oxide epoxy resin may have at least two epoxy groups in one molecule and may include a suitable material containing a propylene oxide group in the molecular chain. The propylene oxide epoxy resin may include bisphenol-based epoxy compounds such as bisphenol A-type epoxy resins, bisphenol A-type epoxy acrylate resins, bisphenol F-type epoxy resins, and the like; aromatic epoxy compounds such as polyglycidyl ether epoxy resins, polyglycidyl ester epoxy resins, and the like; alicyclic epoxy compounds; novolac-type epoxy compounds such as cresol novolac epoxy resins, phenol novolac epoxy resins, and the like; glycidyl amine epoxy compounds; glycidyl ester epoxy compounds; biphenyl diglycidyl ether epoxy compounds, etc.

The urethane acrylate may include a double bond in a urethane bond and both ends thereof. A suitable polymerization reaction may be used for preparation of the urethane acrylate. The urethane acrylate may have a weight average molecular weight of 1,000 g/mol to 50,000 g/mol. Within this range, the film may be efficiently formed and have good compatibility.

The curing materials may further include an acetal compound, a carbodiimide compound, etc.

The curing materials may be present in an amount of 10 wt % to 50% based on the total weight of the conductive layer for the conductive film in terms of solid content. Within this content range of the curing materials, the film may exhibit excellent properties in terms of adhesion and connection reliability, and have a dense curing structure to provide good long-term connection reliability while preventing deterioration in adhesion. The curing system may be present in an amount of 15 wt % to 40 wt %.

In an example embodiment, the conductive particles are dispersed in the conductive layer of the conductive film and serve to electrically connect the connection member.

The conductive particles may include metal particles including Au, Ag, Ni, Cu, and Pb; carbon particles; metal-coated polymer resin particles; and insulated particles obtained by coating surfaces of the metal-coated resin particles with an insulating material. The polymer resin may include polyethylene, polypropylene, polyester, polystyrene, and polyvinyl alcohol, etc. The metal for coating the polymer resin may include Au, Ag, Ni, Cu, and Pb, etc.

In an example embodiment, an adherend is an indium tin oxide (ITO) glass surface in the case of outer lead bonding (OLB). The conductive particles may have cores that are composed of plastic materials to prevent damage on the ITO glass surface by pressure generated in the connection process of the anisotropic conductive film. Further, for a PCB substrate, metal particles such as Ni may be used, and for a plasma display panel (PDP), where high voltage is applied to a circuit, the conductive particles may be obtained by plating metal particles such as Ni with gold (Au). Furthermore, in the case of chip-on-glass (COG) or chip-on-film (COF) having a narrow pitch, the conductive particles may be insulating conductive particles obtained by coating surfaces of conductive particles with a thermoplastic resin.

The size of the conductive particles may be determined depending on the pitch of circuits to be applied and ranges from 1 µm to 30 µm, e.g. from 3 µm to 20 µm, according to intended application. The conductive particles may be present in an amount of 1 wt % to 10 wt % based on the total weight of the conductive layer for the conductive film in terms of solid content. Within this content range, the conductive particles may help secure stable connection reliability and prevent short circuit due to agglomeration of the conductive particles between pitches during thermal compression.

The base films for the curable film and the conductive film may be formed of a suitable material. For example, the base films may be formed of polyolefin films, such as polyethylene, polypropylene, ethylene/propylene copolymer, polybutene-1, ethylene/vinyl acetate copolymer, mixtures of polyethylene/styrene butadiene rubbers, polyvinyl chloride, etc. In addition, the base film may be formed of polymers, such as polyethylene terephthalate, polycarbonate, poly(methyl methacrylate), and the like, thermoplastic elastomers, such as polyurethane, polyamide-polyol copolymer, and the like, and mixtures thereof. The thickness of the base film may be selected from a suitable range and, for example, may be 10 µm to 50 µm.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Descriptions of details apparent to those skilled in the art may be omitted for clarity.

EXAMPLE 1

Preparation of Anisotropic Conductive Film Including Curable Film and Conductive Film

PREPARATIVE EXAMPLE 1

Preparation of Curable Film

In MEK (methylethylketone), 5 wt % of cumyl peroxyneodecanoate (CND), 85 wt % of polyurethane (NPC7007T, NPA6030), 10 wt % of silica (R812) and mercapto silane (KBM403) were mixed to prepare a composition for a curable layer of the curable film. The prepared composition for the curable layer was coated on a polyethylene terephthalate release film, followed by drying with hot air at 55° C. for 5 minutes, thereby preparing a 12 µm thick curable film.

PREPARATIVE EXAMPLE 2

Preparation of Conductive Film

In MEK (methylethylketone), 30 wt % of phosphate acrylate (P2M), 4-hydroxy butyl acrylate (4HBA) and diacrylate (M215), 47 wt % of polyurethane (NPC7007T, NPA6030), 20 wt % of silica (R812) and mercapto silane (KBM403), and 3 wt % of conductive Au—Ni particles (N2EX3B) were mixed in MEK (methylethylketone) to prepare a composition for a conductive layer of the conductive film. The prepared composition for the curable layer was coated on a polyethylene terephthalate release film, followed by drying with hot air at 55° C. for 5 minutes, thereby preparing a 6 μm thick conductive film.

PREPARATIVE EXAMPLE 3

Preparation of Semiconductor Device Connected by Anisotropic Conductive Film

The curable film prepared in Preparative Example 1 was attached to COF having an electrode thickness of 18 μm by pre-compression at 30° C. under a load of 1 MPa for 1 second. The conductive film prepared in Preparative Example 2 was attached to a 0.5 mm ITO glass panel by pre-compression at 30° C. under a load of 1 MPa for 1 second. After removing base films from each of COF having the curable film attached thereto and the ITO glass panel having the conductive film attached thereto, primary compression was performed at 120° C. under a load of 3 MPa for 5 seconds to bond the COF to the glass panel.

EXAMPLES 2 TO 4

Preparation of Anisotropic Conductive Film

Anisotropic conductive films were prepared in the same manner as in Example 1 except for compositions as listed in Table 1 of FIG. 4a.

EXAMPLE 5

In PGMEA (propylene glycol monomethylether acetate), 5 wt % of 1,4-phenylene diisocyanate (capsulated), 85 wt % of polyurethane (NPC7007T, NPA6030), 10 wt % of silica (R812) and diethylene diamine were mixed to prepare a composition for a curable layer of the curable film. The prepared composition for the curable layer was coated on a polyethylene terephthalate release film, followed by drying with hot air at 70° C. for 5 minutes, thereby preparing a 12 μm thick curable film.

In PGMEA (propylene glycol monomethylether acetate), 15 wt % of ethylene diamine, 15 wt % of diethylene triamine, 47 wt % of polyurethane (NPC7007T, NPA6030), 20 wt % of silica (R812), and 3 wt % of conductive Au—Ni particles (N2EX3B) were mixed to prepare a composition for a conductive layer of the conductive film. The prepared composition for the curable layer was coated on a polyethylene terephthalate release film, followed by drying with hot air at 70° C. for 5 minutes, thereby preparing a 6 μm thick conductive film.

COMPARATIVE EXAMPLE 1

Preparation of Double-Layered Anisotropic Conductive Film

Preparation of Non-Conductive Film
In MEK (methylethylketone), 5 wt % of cumyl peroxyneodecanoate (CND), 80 wt % of polyurethane (NPC7007T, NPA6030), 10 wt % of silica (R812) and mercapto silane (KBM403) were mixed. The mixture was coated on a PET release film, followed by drying in a drier at 70° C. to volatilize the solvent, thereby preparing a 12 μm thick non-conductive film.

Preparation of Conductive Film
In MEK (methylethylketone), 25 wt % of phosphate acrylate (P2M), 4-hydroxy butyl acrylate (4HBA) and diacrylate (M215), 5 wt % of cumyl peroxyneodecanoate (CND), 45 wt % of polyurethane (NPC7007T, NPA6030), 15 wt % of silica (R812) and mercapto silane (KBM403), and 3 wt % of conductive Au—Ni particles (N2EX3B) were mixed to prepare a composition for a conductive layer of the conductive film. The prepared conductive composition was coated onto a polyethylene terephthalate release film, followed by drying with hot air at 70° C. for 5 minutes, thereby preparing a 6 μm thick conductive film.

Preparation of Double-Layered Anisotropic Conductive Film
The prepared conductive and non-conductive films were bonded to each other by lamination at 40° C. under a load of 1 MPa to prepare a double-layered anisotropic conductive film having the anisotropic conductive film stacked on the non-conductive film.

COMPARATIVE EXAMPLE 2

Preparation of Combined Anisotropic Conductive Film

In MEK (methylethylketone), 27 wt % of phosphate acrylate (P2M), 4-hydroxy butyl acrylate (4HBA) and diacrylate (M215), 10 wt % of cumyl peroxyneodecanoate (CND), 35 wt % of polyurethane (NPC7007T, NPA6030), 25 wt % of silica (R812) and mercapto silane (KBM403), and 3 wt % of conductive Au—Ni particles (N2EX3B) were mixed to prepare an anisotropic conductive composition. The prepared composition was coated onto a polyethylene terephthalate release film, followed by drying with hot air at 70° C. for 5 minutes, thereby preparing an 18 μm anisotropic conductive film.

COMPARATIVE EXAMPLE 3

Preparation of Combined Anisotropic Conductive Film

An anisotropic conductive film was prepared in the same manner as in Comparative Example 2 except for the composition as listed in Table 1. In Table 1, the content of each component is in unit of wt %.

EXPERIMENTAL EXAMPLE

Property Measurement

The anisotropic conducive films prepared in Examples 1 to 5 and Comparative Example 1 to 3 were measured as to storage stability and adhesive strength as follows. Results are shown in Table 2 of FIG. 4b.

1. Storage Stability
Initial storage stability of film samples was measured using a differential scanning calorimeter (DSC) within 1 hour after sampling. Then, the prepared samples were left in a vacuum oven at 40° C. for 24 hours and for 72 hours, and storage stability of the film samples were measured. In a DSC method, equilibrium state was set at 0° C. using a differential scanning calorimeter (DSC), and the heating value was then measured while increasing the temperature from 0° C. to 200° C. at a speed of 10° C. per minute 2. Adhesive Strength Initial adhesive strength was measured within 1 hour after preparation of film samples. Then, the film samples were left in a vacuum oven at 40° C. for 24 hours and for 72 hours, and the adhesive strength of the film samples was measured. In the case of the separable ACFs, the conductive layer and the curable layer were attached to a 0.5 mm ITO glass and COF by pre-compression, respectively, and base films were removed from the films, followed by primary compression. Then, adhesive strength of the ACFs was measured using a 90 degree peel tester. In the case of the double layered ACF, the non-conductive film was laminated onto the conductive film, and subjected to pre-compression to ITO glass and primary compression to COF, followed by evaluation of adhesive strength (Pre-compression conditions: 30° C.×1 MPa×1 sec, Primary compression conditions: 120° C.×3 MPa×5 sec).

In Table 2, the separable anisotropic conductive films prepared in Examples 1 to 5 had a difference of 40 J/g between heating values after storage for 24 hours at 40° C. and after storage for 72 hours at 40° C. and did not undergo curing reaction, thereby exhibiting excellent storage stability. On the contrary, the anisotropic conductive films prepared in Comparative Examples 1 to 3, in which a single layer contains both the curing materials and the thermal initiator, had a large difference in heating values due to curing reaction, and provided low storage stability.

By way of summation and review, if a thermal compression process is performed in a predetermined condition with an anisotropic conductive film placed between circuits to be connected, the circuit terminals may be electrically connected to each other by conductive particles and a space between the adjacent circuit terminals may be filled with an insulating bonding resin such that the conductive particles are present independently of each other, thereby providing insulating properties.

Demand for lighter, slimmer, shorter and smaller IT devices, and higher resolution of flat panel displays, has focused attention on multilayer anisotropic conductive films are very widely used in the art. When a multilayer film is connected to a glass substrate and a chip-on-film (COF) (or flexible printed circuit board (FPCB)), a conductive layer of the film may be placed on the glass substrate and an insulating layer thereof may be placed on the COF (or FPCB).

In general, when a display device is manufactured using the anisotropic conductive film in practice, electrical connection may be obtained through a pre-compression process in which an anisotropic conductive film is arranged on a glass substrate and secured thereto by thermal compression, followed by removing a release film, and a primary compression process in which a connection member including a chip or a circuit is placed on the glass substrate and compressed thereto. Generally, the anisotropic conductive film may be subjected to thermal compression at a relatively high temperature of 150° C. to 220° C. However, a liquid crystal display or a circuit board may be damaged by high thermal compression temperature, and when substrates having different coefficients of thermal expansion are connected to each other, dimensional precision may be lowered by the different coefficients of thermal expansion.

Ultralow temperature rapid curing, in which a thermal compression temperature is lowered to an ultralow temperature, may be advantageous. In ultralow temperature rapid curing, bonding may occur at a temperature of 100° C., e.g., 80° C., and if the curing speed is high, curing may performed at room temperature; this may deteriorate storage stability. Thus, storage stability may be affected in ultralow temperature rapid curing.

Microcapsule technology, chemical reaction technology using reactants such as a block isocyanate, and technology using a crystalline melting point may be used to realize ultralow temperature rapid curing. Further, a system using other forms of energy than heat has been considered.

A thermal curing-based technique may be generally adopted in the market, such that it may be desirable to use equipment based on thermal curing. Thus, an anisotropic conductive film that allows ultralow temperature rapid curing and exhibits excellent storage stability using thermal curing may be advantageous.

As described above, embodiments may provide an anisotropic conductive film that may achieve ultralow temperature rapid curing using a thermal curing system while securing storage stability and adhesion preservation, and a method of manufacturing a semiconductor device connected by the film. Embodiments may provide an anisotropic conductive film having a curable film and a separate conductive film, which may provide ultralow temperature rapid curing while securing storage stability and directly using an existing thermal compression/curing system. An anisotropic conductive film or semiconductor device according to embodiments may achieve ultralow temperature rapid curing using thermal curing while securing excellent storage stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A method of manufacturing a semiconductor device, the method comprising:
    attaching a curable film to a first connection member including a first circuit terminal;
    attaching a conductive film to a second connection member including a second circuit terminal; and
    thermally compressing the first connection member to the second connection member, with the first connection member having the curable film attached thereto and the second connection member having the conductive film attached thereto placed such that the curable film and the conductive film face each other,
    wherein the curable film includes a thermal initiator and a binder.

2. The method as claimed in claim 1, wherein the first circuit terminal and the second circuit terminal are connected to each other when the first connection member having the curable film attached thereto and the second connection member having the conductive film attached thereto are subjected to thermal compression.

3. The method as claimed in claim 1, wherein the first connection member is a chip on film (COF), a flexible printed circuit board (FPCB), or a semiconductor chip, and the second connection member is a glass panel or a printed circuit board (PCB).

4. A method of manufacturing a semiconductor device, the method comprising:
- attaching a curable film to a first connection member including a first circuit terminal;
- attaching a conductive film to a second connection member including a second circuit terminal; and
- thermally compressing the first connection member to the second connection member, with the first connection member having the curable film attached thereto and the second connection member having the conductive film attached thereto placed such that the curable film and the conductive film face each other,
- wherein the conductive film includes a binder, curing materials, and conductive particles, and is free from a thermal initiator.

5. The method as claimed in claim 4, wherein the curable film includes a thermal initiator and a binder.

6. A method of manufacturing a semiconductor device, the method comprising:
- attaching a curable film to a first connection member including a first circuit terminal;
- attaching a conductive film to a second connection member including a second circuit terminal; and
- thermally compressing the first connection member to the second connection member, with the first connection member having the curable film attached thereto and the second connection member having the conductive film attached thereto placed such that the curable film and the conductive film face each other,
- wherein the curable film or the conductive film has corrugations formed therein.

7. The method as claimed in claim 6, wherein the corrugations have prism shapes.

8. A method of manufacturing a semiconductor device, the method comprising:
- attaching a curable film to a first connection member including a first circuit terminal;
- attaching a conductive film to a second connection member including a second circuit terminal; and
- thermally compressing the first connection member to the second connection member, with the first connection member having the curable film attached thereto and the second connection member having the conductive film attached thereto placed such that the curable film and the conductive film face each other,
- wherein the curable film has a difference of 40 J/g or less between heating values after storage for 24 hours at 40° C. and after storage for 72 hours at 40° C., and the conductive film has a difference of 40 J/g or less between heating values after storage for 24 hours at 40° C. and after storage for 72 hours at 40° C.

* * * * *